(12) United States Patent
Amourah

(10) Patent No.: US 6,784,734 B2
(45) Date of Patent: Aug. 31, 2004

(54) ALL DIGITAL TRANSISTOR HIGH GAIN OPERATIONAL AMPLIFIER USING POSITIVE FEEDBACK TECHNIQUE

(75) Inventor: Mezyad Amourah, Ames, IA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/163,772

(22) Filed: Jun. 5, 2002

(65) Prior Publication Data

US 2003/0227326 A1 Dec. 11, 2003

(51) Int. Cl.[7] .................................................. H03F 3/45
(52) U.S. Cl. ...................................... 330/253; 330/260
(58) Field of Search ................................ 330/252, 253, 330/259, 260, 311, 292

(56) References Cited

U.S. PATENT DOCUMENTS 5,272,395 A * 12/1993 Vincelette .................... 307/355
5,345,346 A *  9/1994 Brannon et al. .............. 360/67

* cited by examiner

Primary Examiner—Steven J. Mottola
(74) Attorney, Agent, or Firm—W. Daniel Swayze, Jr.; W. James Brady; Frederick J. Telecky, Jr.

(57) ABSTRACT

A new all digital transistor CMOS very high DC-gain amplifier (30) that uses an internal positive-feedback technique. This amplifier (30) does not require perfect matching of transistors (M2,M3) to achieve the very high DC gain. The DC gain has a very low sensitivity to the output voltage swing. An implementation of a sample and hold circuit (60) constructed using the amplifier (30) is also described. A special layout pattern (80) is used to cut the parasitic capacitance to enhance the amplifier speed.

10 Claims, 5 Drawing Sheets

DC SWEEP, Gmax = 21k
V SWING = 2V PK − PK

ALL DIGITAL TRANSISTOR HIGH GAIN OPERATIONAL AMPLIFIER USING POSITIVE FEEDBACK TECHNIQUE

FIELD OF THE INVENTION

The present invention is generally related to operational amplifiers, and more particularly to operational amplifiers having positive feedback.

BACKGROUND OF THE INVENTION

High gain, accuracy, and high speed are the most important properties of analog circuits. A variety of analog and mixed signal systems have performance that is limited by the settling behavior of a CMOS amplifier. These include switched capacitor filters, Algorithmic A/D converters, sigma-delta converters, sample and hold circuits, and pipeline A/D converters. The settling behavior of the Op-Amp determines the accuracy and the speed that can be reached. Fast settling requires single pole settling behavior, and a high gain-bandwidth-product. High accuracy requires high DC gain.

The task of building a fast Op-Amp with very high DC-gain is a very difficult problem. The high unity gain frequency, high speed, calls for single stage design with short channel devices biased with high current levels. The high DC-gain Op-amp can be implemented by one or more of the following techniques. These techniques include are cascading of gain stages, applying dynamic biasing technique, or using output impedance enhancement technique. Cascading two stages or more may result in a very high DC-gain. However, proper compensation for stable operation will seriously limit the high frequency performance. The second method, dynamic biasing technique, combines high DC gain and fast settling speed. However, in dynamically biased amplifiers, and during the last settling period, transistors turn into weak inversion region which dramatically slows the settling. Dynamically biased amplifiers have limited acceptance because of this disadvantage. Moreover, a single stage dynamically biased amplifier may not provide sufficient gain, and cascading them is very difficult. The third method of enhancing amplifier DC-gain is to increase its output impedance. This task can be performed either by cascoding, stacking of transistors at the output node, using gain-boosting technique, or by using the negative conductance, positive feedback method. Cascoding is a well-known method to enhance amplifier output impedance, where the amplifier output impedance, gain, becomes proportional to the square, or the cube of the intrinsic transistor gain, $g_m/g_o$. One level of cascoding doesn't provide sufficient DC-gain. A triple cascoded amplifier has a very limited output swing, and is not applicable to low-voltage circuits. Moreover, as we go deep in sub-micron processes, the intrinsic transistor resistance becomes smaller and smaller which limits the advantage of cascoding.

Enhancing amplifier gain by the gain-boosting technique is one of the most successful ways of boosting amplifier gain without limiting the high frequency performance. However, boosting amplifiers add their own poles and zeros to the final amplifier, which in general will exhibit zero-pole doublets that affect amplifier settling making it slow. As the industry moves toward using the new digital CMOS processes, Cascading, Cascoding, and Gain-boosting techniques loose their ability to provide very high DC gain amplifiers because digital transistors have a high output conductance. Expensive solutions like using the special analog friendly devices are used most of the time.

The final method to boost the gain is using the positive feedback technique, negative conductance. Positive feedback offers the ability of obtaining a very high DC gain, ideally infinite gain, without affecting high frequency performance. However, most of the conventional positive feedback implementations have suffered from two problems. First, a strong dependence of amplifier gain on transistor matching. Second, a strong gain sensitivity to output signal swing. Since a wide swing operation, is desired the DC gain of the amplifier will drop sharply as the output node swings up or down, and this problem is not mentioned in the literature. However, the positive feedback method still holds potential to build fast amplifiers with high DC gain.

SUMMARY OF THE INVENTION

The present invention achieves technical advantages as an operational amplifier having positive feedback provided to a standard telescopic cascoded amplifier. Self-adjusting feedback, in combination with cascoding, provides the technical advantages of allowing transistor matching requirements to be relaxed. The positive feedback signal used to enhance the DC-gain is derived from extra nodes created by cascoding. The configuration of the present invention considerably reduces the effect of the output voltage level swing on the amplifier gain. Moreover, the present invention achives high gain and output swing even when using only digital transistors. This implementation results in smaller amplifier silicon area compared to amplifiers implemented using special analog transistors. Smaller devices will result in faster response for the same power budget.

The positive feedback signal experiences very small swings compared to the output differential voltage swings, therefore, the positive feedback is almost unaffected by the output voltage signal level swing. In this design, the positive feedback is active in the differential mode, and is a negative feedback in the common mode. Since the gain is dependent on the biasing parameters, the negative feedback helps the amplifier to maintain the high DC gain condition once it is in this state.

DETAILED DESCRIPTION OF THE PREFERRED EMBODIMENT

Figure 1A:
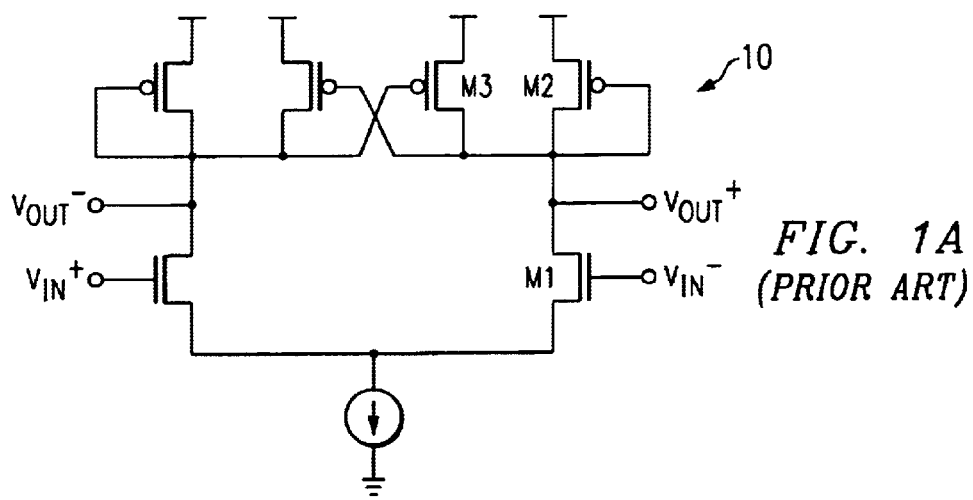
FIG. 1A is a schematic of conventional cross-coupled active-load PMOS transistors applied to a simple differential pair of transistors.
Figure 1B:
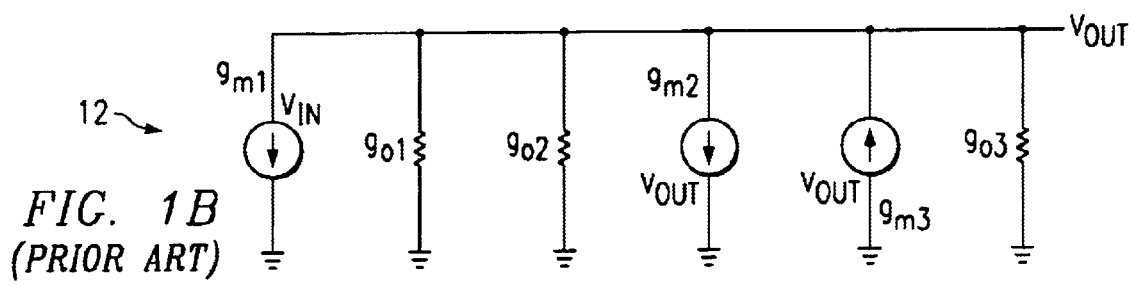
FIG. 1B is a small signal model of the schematic of FIG. 1A.
Figure 1C:
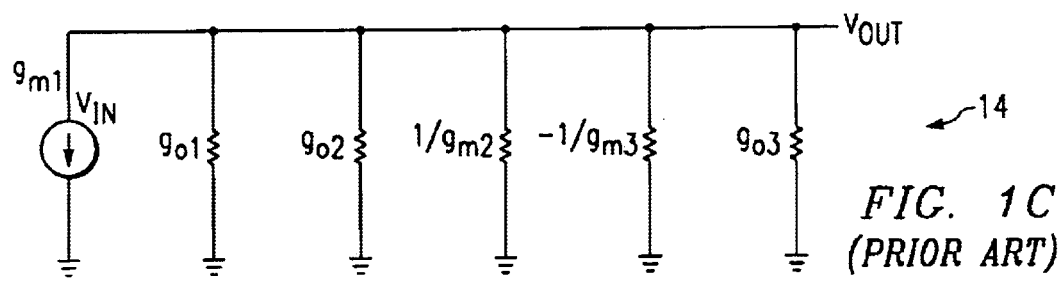
FIG. 1C is a simplified small signal model of the schematic of FIG. 1B.

The concept of applying a positive feedback, also known as negative conductance, to enhance amplifier gain has been proposed in several publications. Most of the proposed structures share the common characteristic of generating a negative resistance by feedback from the output node that is used to compensate some positive resistance at the output to achieve the very high DC gain. To illustrate the idea, a simple example is cross-coupled active-load PMOS transistors applied to a simple differential pair as shown at 10 in FIG. 1A. The negative conductance, −gm3, generated by the cross coupling is used to boost the DC gain. The small signal model is shown at 12 in FIG. 1B, and is simplified at 14 in FIG. 1C. A small signal analysis shows that the DC gain of the amplifier can be written as:

$$A_v = \frac{-g_{m1}}{g_{o1} + g_{o2} + g_{o3} + g_{m2} - g_{m3}}$$

If $g_{m3}=g_{o1}+g_{o2}+g_{o3}+g_{m2}$ then the amplifier will exhibit an infinite DC gain. Note that no additional nodes, poles, are added. However, to get the very high DC gain almost perfect matching is needed mainly between $g_{m2}$ and $g_{m3}$, since $g_m>>g_o$. The perfect matching requirement can be relaxed by two methods. First, make one of the important parameters controllable. Second, use some kind of cascoding such that the amplifier DC gain is not completely dependent on the perfect matching issue. Therefore, the existence of cascoding will allow more room for the parameters to move in. A major problem that still exists is that $g_{m2,3}$ and $g_{o\;1,2,3}$ are output level dependent. If this amplifier is used in a sample and hold circuit that is fully differential, then the output-node voltage level will exhibit a change in value by ±250 mV. The change of the gate to source voltage of transistors M2 and M3 by ±250 mV will completely kill the amplifier gain while settling. This gain variation will also introduce nonlinear distortion. Almost all the previously proposed architectures have this property.

The present invention achieves technical advantages, and avoids most of the disadvantages accompanied with conventionally implementing the positive feedback technique, by implementing the positive feedback to second and third order amplifiers. The amplifier shows very high DC gain with stable operation, without the requirement of extra sophisticated circuitry to control the gain.

Figure 2A:
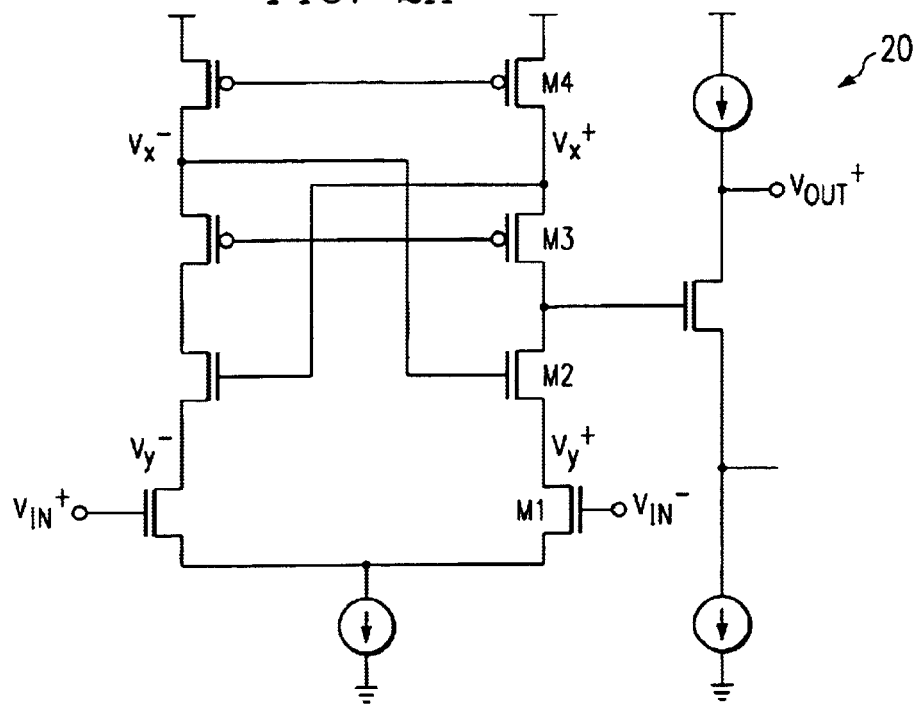
FIG. 2A is a schematic of the positive feedback amplifier according to the present invention.

The present invention advantageously provides a new amplifier by applying positive-feedback to a standard telescopic cascoded amplifier. By applying a self-adjusting feedback, in combination with cascading, the transistor matching requirements are relaxed. The positive feedback signal used to enhance the DC-gain is derived from the extra nodes created by cascoding. This invention considerably reduces the effect of the output voltage level on the amplifier gain, the gain sensitivity to output voltage level. FIG. 2A shows at 20 the application of the positive feedback to a traditional telescopic amplifier. The amplifier 20 presented here is a fully differential one. Common mode feed back circuits, and biasing circuits are not shown for simplicity. The first stage of the amplifier is shown at 20 in FIG. 2A. Ignoring the bulk effect, for simplicity of expressions, has an open-loop gain, Av, of the form:

$$A_v \approx \frac{g_{m1} \cdot (g_{o2} - g_{m2}) g_{m3}}{g_{o1}[g_{o2}g_{m3} + g_{o3}g_{o4} + g_{o3}g_{o4}g_{m2} + g_{o2}g_{o3} - g_{o3}g_{m2}]}$$

Assuming that $g_{o1}=g_{o4}$, and $g_{o2}<<g_{m2}$, then, voltage gain can be written as:

$$A_v \approx \frac{-g_{m1} \cdot g_{m2} \cdot g_{m3}}{g_{o1}(g_{o2} \cdot g_{m3} - g_{o3} \cdot g_{m2})}$$

Figure 4A:
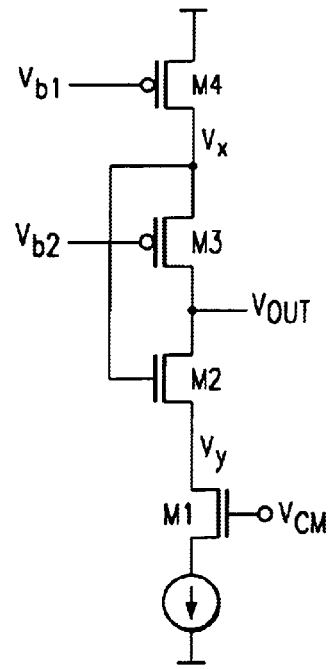
FIGS. 4A and 4B is a schematic of the $1^{st}$ stage from common mode perspective.
Figure 4B:
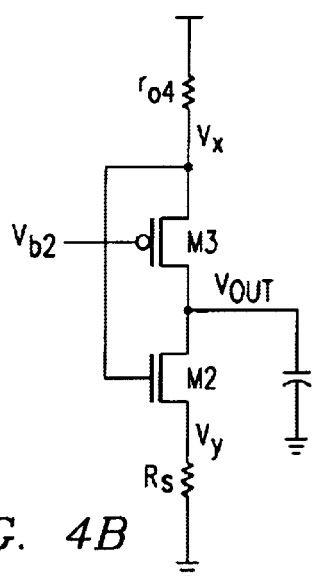
Figure 5A:
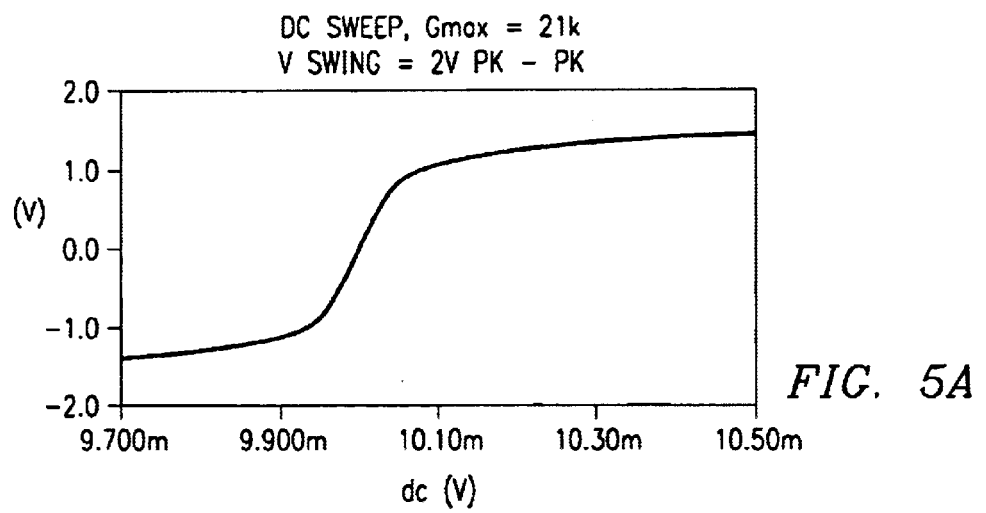
FIGS. 5A and 5B depict the high output swing, and high gain with low gain sensitivity to the output swing.
Figure 5B:
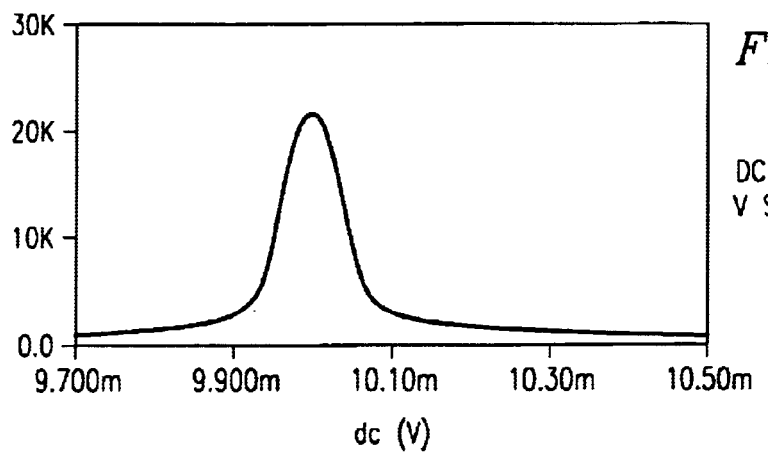

The equation shows that the DC-gain of the amplifier can be infinite as $g_{o2}$ approaches $(g_{m2}/g_{m3})g_{o3}$. Looking back to FIG. 2A, the positive feedback in the differential mode is a negative feedback in the common mode. This negative feedback helps the amplifier to adjust its biasing condition to maintain the high gain. To understand this point, note that the operating point of the transistor $M_2$ is set by the positive feedback connection. From a common mode perspective, nodes $V_{x\pm}$ are the same. Therefore, the common mode circuit of the first stage can be redrawn as shown in FIGS. 4A, and 4B. To see how process variations will affect the behavior of the circuit, let us consider the strong PMOS case. For this case, absolute value of $V_{th}$ for the PMOS transistors will be lower resulting in larger $g_o$ and $g_m$. Therefore, both the nodes $V_{out\_T}$ and $V_x$ will be pulled up towards $V_{dd}$. Since transistor $M_2$ forms an inverting common source amplifier with source degeneration, increasing its $V_{gs}$ will turn it on harder pulling nodes $V_x$ and $V_{out\_T}$ back down. This negative feedback loop, shown in FIG. 4B has a large gain and its operation is consistent with the operation of the common mode feedback circuit. A similar argument can be made for the other process corners. The negative feedback that adjusts the biasing voltages is more effective by fixing $V_y$. Even better results are achieved by making $V_y$ move in a direction opposite to that of $V_x$, and $V_{out\_T}$. Our approach is graphically shown in FIG. 5. The existence of the extra biasing circuitry has two main functions: First, it defines, determines, the quiescent biasing voltage, $V_y$. Second, it helps move the node $V_y$ in the opposite direction of $V_x$ and $V_{out\_T}$ further compensating for transistor parameter variations.

Figure 2B:
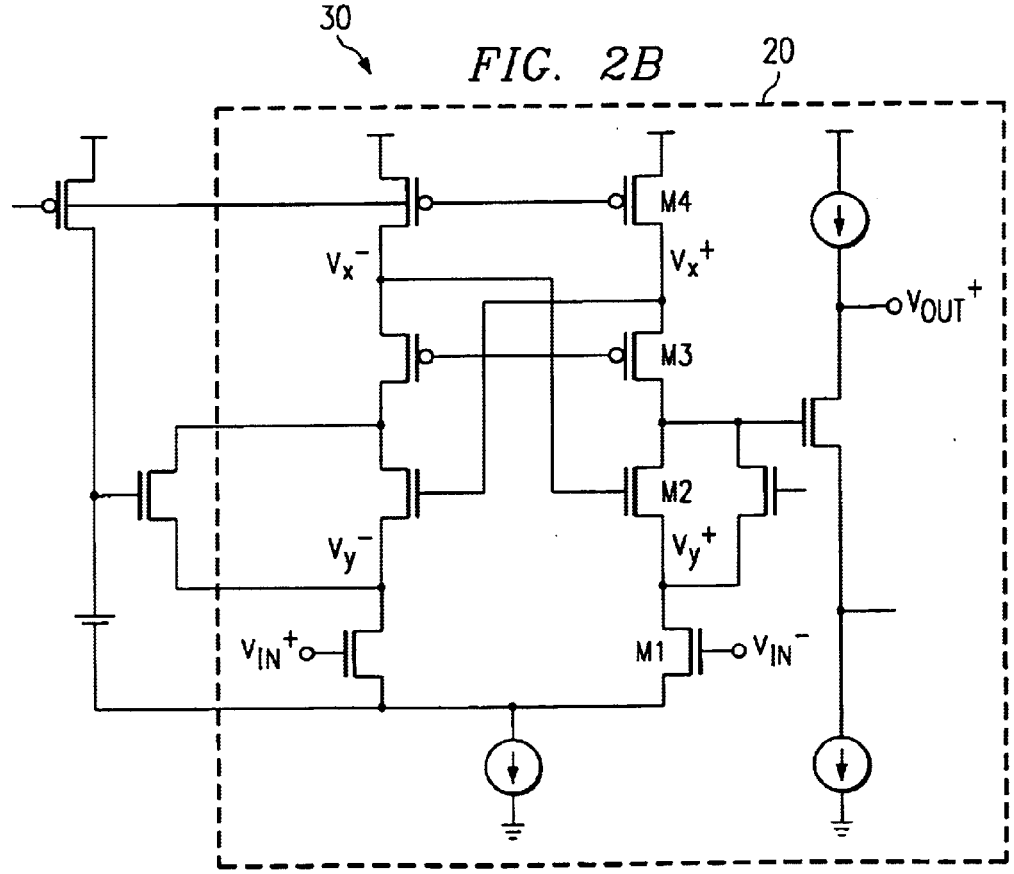
FIG. 2B is a schematic of the full amplifier comprising a telescopic cascoded amplifier having positive feedback.
Figure 3:
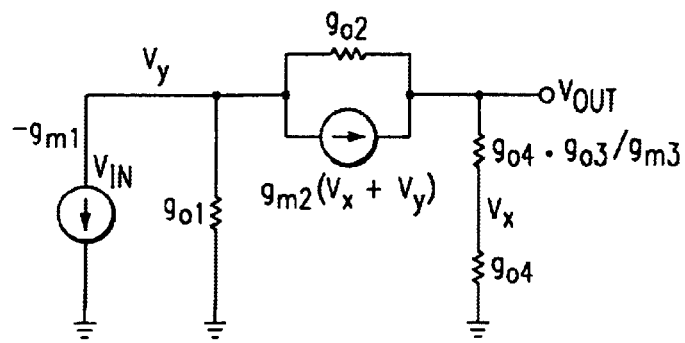
FIG. 3 is a schematic of the small signal model of the $1^{st}$ stage of the amplifier shown in FIG. 2B.

The final amplifier simplified schematic is shown at 30 in FIG. 2B. Voltages $V_{x+}$ and $V_{x-}$ experience very small swings compared to voltages $V_{out+}$ and $V_{out-}$ since $V_x=V_{out}/(g_{m3}/g_{o3})/G_s$, where $G_s$ is the gain of the common source output stage. For example in this design, $((g_{m3}/g_{o3})*G_s)>200$. So, if the differential output voltage swing is one volt, $V_{out}=V_{cm}\pm 250$ mV, then voltage $V_x$ experiences a swing that can be written as $V_x<V_{cm}\pm 1.25$ mV. Therefore, the feedback is almost unaffected by the output voltage signal level.

Figure 6A:
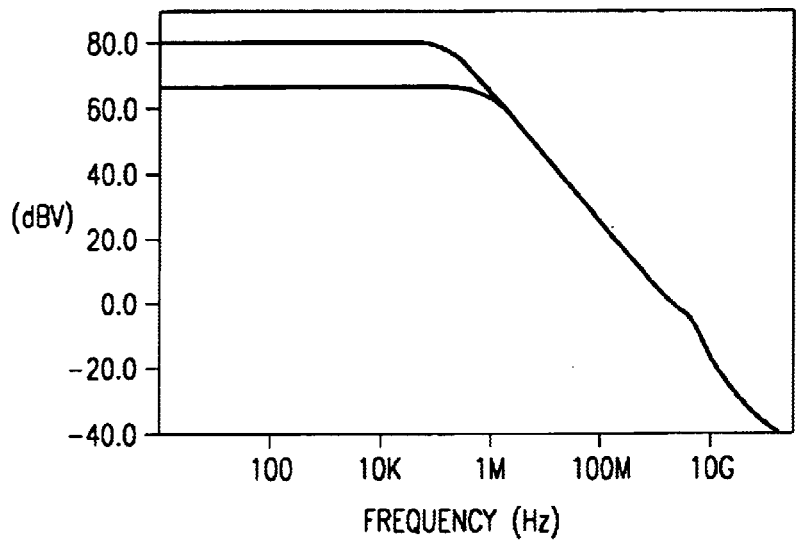
FIGS. 6A and 6B depict the improved DC-gain and phase margin, respectfully, of the present invention as compared to a conventional amplifier.
Figure 6B:
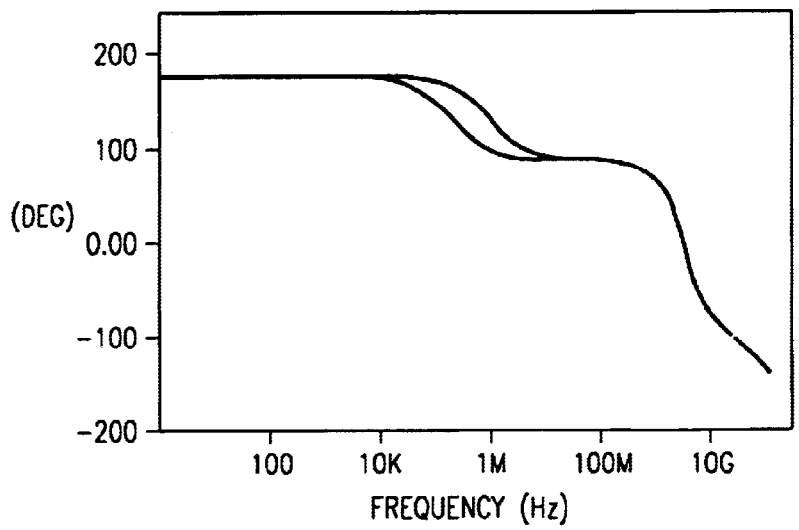

Finally, the amplifier 20 shown in FIG. 2A is applied to a sample and hold circuit with a sampling frequency of 165 MHz. This sample and hold circuit has high speed slewing and settling as will be discussed shortly in reference to FIG. 6. To enhance the speed of the operational-amplifier 20 a special transistor layout pattern is used. Since the side-wall capacitance of the transistor is much smaller than the diffusion capacitance, the source and drain diffusion are chopped around the contacts as will be discussed shortly. Finally, even though the positive feedback is active in the differential mode, it is a negative feedback in the common mode. Since the gain is dependent on the biasing parameters, this negative feedback helps the amplifier to maintain the high DC gain condition once it is in that state. This describes why the DC sweep analysis shows higher DC gain than the AC analysis.

In one embodiment the amplifier 20 consumes a total current of 8.0 mA, two stage, and two common mode feedback circuits, using a supply voltage of 1.8V, and deriving a capacitive load of 1.0 pF. The amplifier has a DC gain of 80 dB with a unity gain frequency of 1.32 GHz. A comparison between the amplifier 20 according to the present invention and the traditional telescopic cascode is shown in Table 1, where both amplifiers have approximately the same power dissipation, the same excess bias on the similar transistors, the same load capacitance, and both are built using digital transistors.

TABLE 1

| Telescopic Amp | Positive feedback | Traditional |
|---|---|---|
| DC-gain | 80 dB | 65 dB |
| Unity gain freq. | 1.318 GHz | 1.324 GHz |
| Load cap. | 1.0 pF | 1.0 pF |
| Phase margin | 59 degrees | 60 degrees |
| Total current | 8 mA | 8 mA |
| Supply voltage | 1.8 V | 1.8 V |

Figure 7:
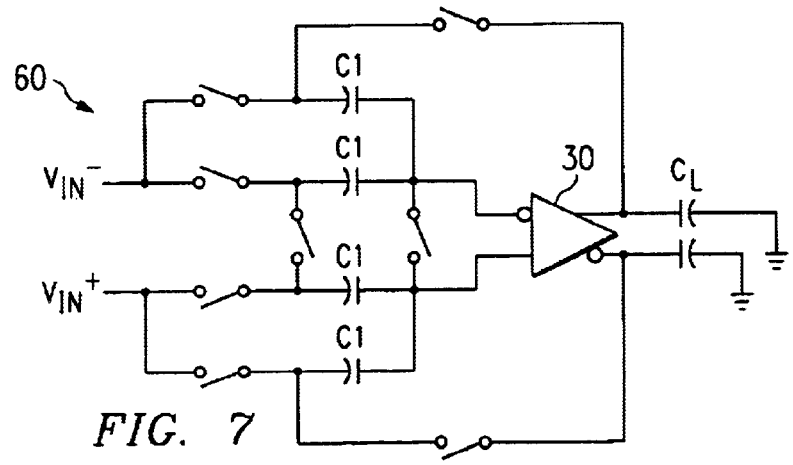
FIG. 7 is a schematic illustrating the amplifier of the present invention implemented in a sample and hold circuit.

The table shows that for approximately the same conditions, the DC-gain is enhanced from 65 dB to 80 dB, for the same load and phase margin. Results are shown in FIGS. 4A and 4B, and FIGS. 5A and 5B. Moreover, the same amplifier architecture was applied to a switched capacitor sample and hold circuit with two non over-lapping clocks at a frequency of 165 MHz loaded by similar stages. One stage is shown at 60 in FIG. 6. The amplifier 60 consumes a total current of 8.0 mA, and drives a load capacitance of 1 pF. The sampling capacitors have a size of 125 fF each. As shown in FIGS. 7A, and 7B. The amplifier is able to slew and settle to an error less than 0.2 mV for a 1V peak-to-peak output swing within 2.2 nsec for nominal and strong process corners where clock speed is not a problem.

Figure 8A:
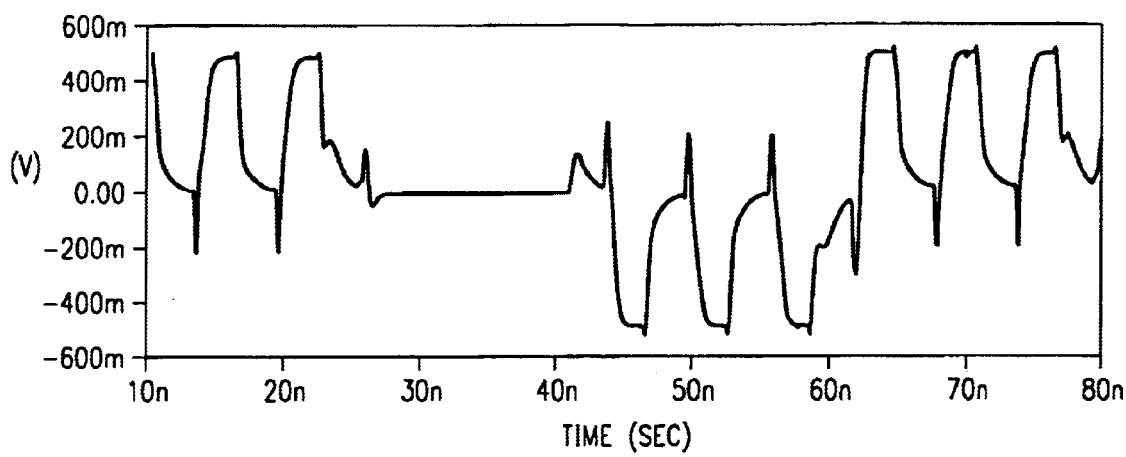
FIGS. 8A and 8B illustrates the slew and settling of the amplifier.
Figure 8B:
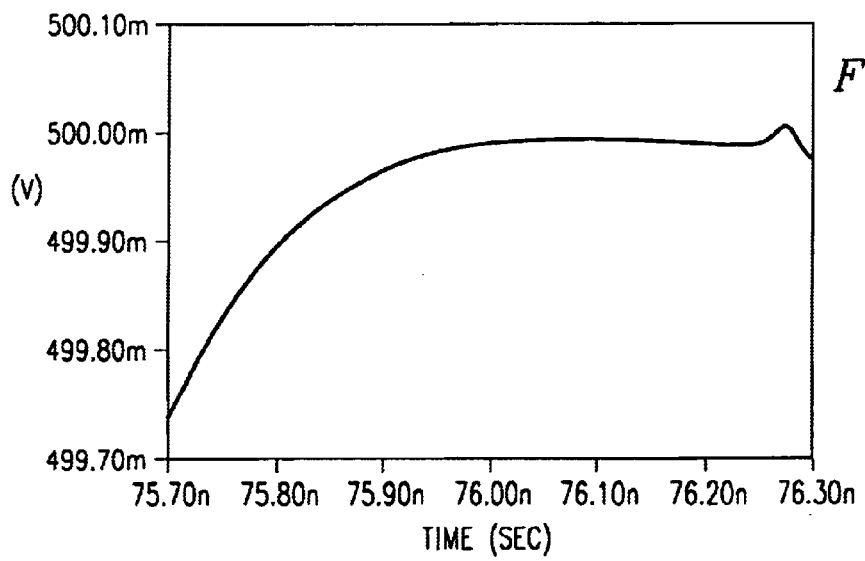
Figure 9:
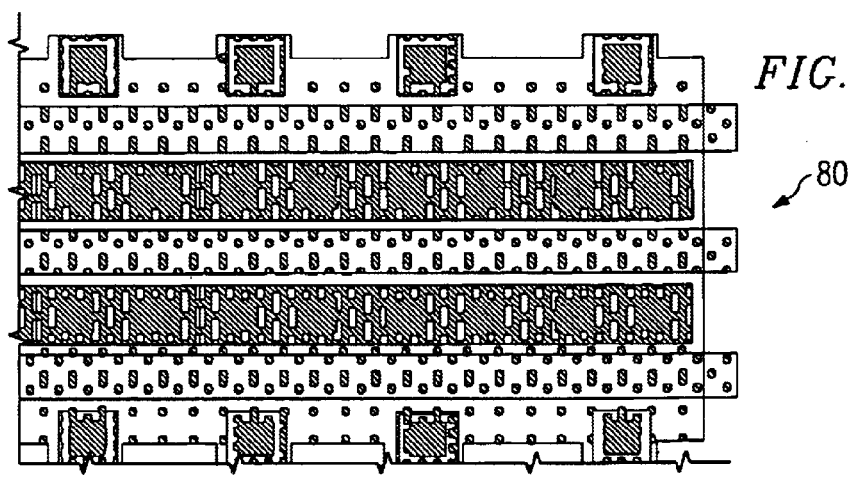
FIG. 9 illustrates the chopped diffusion transistor layout of the digital transistors which reduces the diffusion parasitic capacitance while increasing the sidewall capacitance that has a much lower density.

A chopped diffusion transistor layout is shown in FIG. 8 at 80, whereby using this pattern the diffusion parasitic capacitance is reduced at the expense of increasing the sidewall capacitance. Layout extraction shows that 15% to 20% of the parasitic capacitance value is saved using this technique, which helps slewing speed. This design 80 reduces the parasitic capacitance simply because the sidewall capacitance has much lower density than the diffusion capacitance. Only transistors connected across the output nodes have their diffusion chopped.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

I claim:

1. An operational amplifier, comprising:

a telescopic cascoded amplifier having differential input transistors and an output providing an output signal; and a feedback circuit coupled to the amplifier output and providing positive feedback to the amplifier, the positive feedback being self-adjusting, wherein the telescopic cascaded amplifier has multiple transistors forming multiple nodes, wherein the positive feedback is derived from the multiple nodes wherein the multiple transistors have a chopped diffusion layout to reduce diffusion parasitic capacitance while increasing sidewall capacitance.

2. The amplifier as specified in claim 1 wherein the feedback circuit automatically adjusts the biasing of the amplifier in response to a varying input signal provided to the input thereof to maintain a high constant DC gain.

3. The amplifier as specified in claim 1 wherein the feedback circuit provides the positive feedback signal when operated in a differential mode, and provides a negative feedback signal to the amplifier in a common mode.

4. The amplifier as specified in claim 1 wherein the operational amplifier has a higher DC gain than the operational amplifier without the positive feedback.

5. The amplifier as specified in claim 1 wherein the multiple transistors forming the multiple nodes are not closely matched.

6. The amplifier as specified in claim 1 wherein the positive feedback enhances a DC gain of the amplifier.

7. The amplifier as specified in claim 2 wherein the amplifier has a differential output.

8. An operational amplifier, comprising:

a telescopic cascoded amplifier having differential input transistors and an output providing an output signal; and a feedback circuit coupled to the amplifier output and providing positive feedback to the amplifier, the positive feedback being self-adjusting, wherein the feedback circuit is maintained to be substantially unaffected by a varying output voltage signal of said output signal.

9. An operational amplifier, comprising:

a telescopic cascoded amplifier having differential input transistors and an output providing an output signal; and a feedback circuit coupled to the amplifier output and providing positive feedback to the amplifier, the positive feedback being self-adjusting.

wherein the open loop gain of the amplifier is defined by the equation:

$$A_v = \frac{-g_{m1} \cdot (g_{o2} \cdot g_{m2})}{g_{o1}\left[\frac{g_{o2}g_{o3}}{g_{m3}}\right]\left(\frac{g_{o4}}{g_{o1}}+1\right) - g_{o1}g_{o2}}$$

where: $g_m1$ is the conductance of the differential input transistors;

$g_{m2}$, $g_{m3}$ is the conductance of multiple transistors forming the multiple nodes;

$g_{o1}$ is the gain of the differential input transistors; and $g_{o2}$, $g_{o3}$ is the gain of the multiple transistors forming the multiple nodes.

10. An operational amplifier, comprising:

a telescopic cascoded amplifier having differential input transistors and an output providing an output signal; and a feedback circuit coupled to the amplifier output and providing positive feedback to the amplifier, the positive feedback being self-adjusting, wherein the amplifier is comprised of all MOS transistors, wherein the amplifier is not strobed.

* * * * *